United States Patent
Kuno et al.

(10) Patent No.: US 8,735,770 B2
(45) Date of Patent: May 27, 2014

(54) LASER PROCESSING METHOD FOR FORMING A MODIFIED REGION IN AN OBJECT

(75) Inventors: Koji Kuno, Hamamatsu (JP); Tatsuya Suzuki, Hamamatsu (JP); Kazuhiro Atsumi, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 508 days.

(21) Appl. No.: 12/444,125

(22) PCT Filed: Sep. 27, 2007

(86) PCT No.: PCT/JP2007/068820
§ 371 (c)(1),
(2), (4) Date: May 7, 2009

(87) PCT Pub. No.: WO2008/041604
PCT Pub. Date: Apr. 10, 2008

(65) Prior Publication Data
US 2010/0032418 A1     Feb. 11, 2010

(30) Foreign Application Priority Data

Oct. 4, 2006   (JP) ................ P2006-273296

(51) Int. Cl.
*B23K 26/14*   (2014.01)
*B23K 26/16*   (2006.01)
*B23K 26/06*   (2014.01)

(52) U.S. Cl.
USPC ................ 219/121.67; 219/121.75

(58) Field of Classification Search
USPC ............. 219/121.67, 121.72, 121.73, 121.75, 219/121.77, 121.83, 121.62, 121.68, 219/121.69; 438/468
See application file for complete search history.

(56) References Cited

U.S. PATENT DOCUMENTS 4,546,231 A   10/1985   Gresser et al.
6,992,026 B2   1/2006   Fukuyo et al.
(Continued)

FOREIGN PATENT DOCUMENTS

CN   1160228 A   9/1997
CN   1534763     10/2004
(Continued)

OTHER PUBLICATIONS

U.S. Appl. No. 13/206,181, filed Aug. 9, 2011.
(Continued)

*Primary Examiner* — Dana Ross
*Assistant Examiner* — Thomas Ward
(74) *Attorney, Agent, or Firm* — Drinker Biddle & Reath LLP

(57) ABSTRACT

While a converging lens 108 is relatively moved along a line 50 including a line to cut 5, measuring laser light L2 is converged with the lens 108 when the lens 108 is positioned on a processing region 30 having an outer shape between an object to be processed 1 and a frame 22, and a reflected light component of the laser light L2 reflected by a front face 3 of the object 1 is detected. While keeping a substantially constant distance between the front face 3 and the lens 108 such that a converging point P of processing laser light L1 is positioned at a constant distance from the front face 3 according to the detection, the laser light L1 is converged by the lens 108, so as to form a molten processed region 13 within the object 1.

24 Claims, 10 Drawing Sheets

(56) References Cited

U.S. PATENT DOCUMENTS

| | | |
|---|---|---|
| 7,396,742 B2 | 7/2008 | Fukuyo et al. |
| 7,489,454 B2 | 2/2009 | Fukuyo et al. |
| 7,547,613 B2 | 6/2009 | Fukuyo et al. |
| 7,566,635 B2 | 7/2009 | Fujii et al. |
| 7,592,237 B2 | 9/2009 | Sakamoto et al. |
| 7,592,238 B2 | 9/2009 | Fukuyo et al. |
| 7,605,344 B2 | 10/2009 | Fukumitsu |
| 7,608,214 B2 | 10/2009 | Kuno et al. |
| 7,615,721 B2 | 11/2009 | Fukuyo et al. |
| 7,626,137 B2 | 12/2009 | Fukuyo et al. |
| 7,709,767 B2 | 5/2010 | Sakamoto |
| 7,718,510 B2 | 5/2010 | Sakamoto et al. |
| 7,719,017 B2 | 5/2010 | Tanaka |
| 7,732,730 B2 | 6/2010 | Fukuyo et al. |
| 7,749,867 B2 | 7/2010 | Fukuyo et al. |
| 7,754,583 B2 | 7/2010 | Sakamoto |
| 7,825,350 B2 | 11/2010 | Fukuyo et al. |
| 7,897,487 B2 | 3/2011 | Sugiura et al. |
| 7,902,636 B2 | 3/2011 | Sugiura et al. |
| 7,939,430 B2 | 5/2011 | Sakamoto et al. |
| 7,947,574 B2 | 5/2011 | Sakamoto et al. |
| 2004/0228004 A1* | 11/2004 | Sercel et al. ............... 359/668 |
| 2005/0035099 A1* | 2/2005 | Nakamura et al. ....... 219/121.72 |
| 2005/0202596 A1 | 9/2005 | Fukuyo et al. |
| 2005/0242073 A1 | 11/2005 | Nakamura et al. |
| 2005/0272223 A1 | 12/2005 | Fujii et al. |
| 2006/0144828 A1* | 7/2006 | Fukumitsu et al. ....... 219/121.67 |
| 2006/0148212 A1 | 7/2006 | Fukuyo et al. |
| 2006/0255024 A1 | 11/2006 | Fukuyo et al. |
| 2007/0085099 A1 | 4/2007 | Fukumitsu et al. |
| 2007/0125757 A1 | 6/2007 | Fukuyo et al. |
| 2007/0158314 A1 | 7/2007 | Fukumitsu et al. |
| 2007/0252154 A1 | 11/2007 | Uchiyama et al. |
| 2008/0035611 A1 | 2/2008 | Kuno et al. |
| 2008/0037003 A1 | 2/2008 | Atsumi et al. |
| 2008/0090382 A1 | 4/2008 | Fujii et al. |
| 2008/0218735 A1 | 9/2008 | Atsumi et al. |
| 2008/0251506 A1 | 10/2008 | Atsumi et al. |
| 2009/0008373 A1 | 1/2009 | Muramatsu et al. |
| 2009/0032509 A1 | 2/2009 | Kuno et al. |
| 2009/0098713 A1 | 4/2009 | Sakamoto |
| 2009/0107967 A1 | 4/2009 | Sakamoto et al. |
| 2009/0117712 A1 | 5/2009 | Sakamoto et al. |
| 2009/0166342 A1 | 7/2009 | Kuno et al. |
| 2009/0166808 A1 | 7/2009 | Sakamoto et al. |
| 2009/0250446 A1 | 10/2009 | Sakamoto |
| 2009/0261083 A1 | 10/2009 | Osajima et al. |
| 2009/0302428 A1 | 12/2009 | Sakamoto et al. |
| 2010/0006548 A1 | 1/2010 | Atsumi et al. |
| 2010/0009547 A1 | 1/2010 | Sakamoto |
| 2010/0012632 A1 | 1/2010 | Sakamoto |
| 2010/0012633 A1 | 1/2010 | Atsumi et al. |
| 2010/0015783 A1 | 1/2010 | Fukuyo et al. |
| 2010/0025386 A1 | 2/2010 | Kuno et al. |
| 2010/0055876 A1 | 3/2010 | Fukuyo et al. |
| 2010/0151202 A1 | 6/2010 | Fukumitsu |
| 2010/0176100 A1 | 7/2010 | Fukuyo et al. |
| 2010/0184271 A1 | 7/2010 | Sugiura et al. |
| 2010/0200550 A1 | 8/2010 | Kumagai |
| 2010/0203678 A1 | 8/2010 | Fukumitsu et al. |
| 2010/0203707 A1 | 8/2010 | Fujii et al. |
| 2010/0227453 A1 | 9/2010 | Sakamoto |
| 2010/0240159 A1 | 9/2010 | Kumagai et al. |
| 2010/0258539 A1 | 10/2010 | Sakamoto |
| 2010/0301521 A1 | 12/2010 | Uchiyama |
| 2010/0311313 A1 | 12/2010 | Uchiyama |
| 2010/0327416 A1 | 12/2010 | Fukumitsu |
| 2011/0000897 A1 | 1/2011 | Nakano et al. |
| 2011/0001220 A1 | 1/2011 | Sugiura et al. |
| 2011/0021004 A1 | 1/2011 | Fukuyo et al. |
| 2011/0027971 A1 | 2/2011 | Fukuyo et al. |
| 2011/0027972 A1 | 2/2011 | Fukuyo et al. |
| 2011/0037149 A1 | 2/2011 | Fukuyo et al. |
| 2011/0274128 A1 | 11/2011 | Fukumitsu et al. |

FOREIGN PATENT DOCUMENTS

| | | |
|---|---|---|
| CN | 1599046 | 3/2005 |
| CN | 1638030 | 7/2005 |
| CN | 1643656 | 7/2005 |
| CN | 1720117 | 1/2006 |
| EP | 1 338 371 | 8/2003 |
| JP | 2004-273895 | 9/2004 |
| JP | 2005-193286 | 7/2005 |
| JP | 2005-313188 | 11/2005 |
| JP | 2006-013312 | 1/2006 |
| JP | 2006-051517 | 2/2006 |
| JP | 2006-165594 | 6/2006 |
| JP | 2006-255789 | 9/2006 |
| JP | 2006-332556 | 12/2006 |
| JP | 2007-136554 | 6/2007 |
| JP | 2007-141995 | 6/2007 |
| JP | 2007-167918 | 7/2007 |

OTHER PUBLICATIONS

U.S. Appl. No. 13/269,274, filed Oct. 7, 2011.
U.S. Appl. No. 13/235,936, filed Sep. 19, 2011.
U.S. Appl. No. 13/213,175, filed Aug. 19, 2011.
U.S. Appl. No. 13/233,662, filed Sep. 15, 2011.
U.S. Appl. No. 13/061,438, filed Apr. 26, 2011.
U.S. Appl. No. 13/107,056, filed May 13, 2011.
U.S. Appl. No. 13/151,877, filed Jun. 2, 2011.
U.S. Appl. No. 13/131,429, filed Jun. 28, 2011.
U.S. Appl. No. 13/143,636, filed Sep. 21, 2011.
U.S. Appl. No. 13/148,097, filed Aug. 26, 2011.
U.S. Appl. No. 13/262,995, filed Oct. 5, 2011.
U.S. Appl. No. 13/265,027, filed Oct. 18, 2011.
X. Liu et al., "Laser Ablation and Micromachining with Ultrashort Laser Pulses," IEEE Journal of Quantum Electronics, vol. 33, No. 10, Oct. 1997, pp. 1706-1716.

* cited by examiner

Fig.7
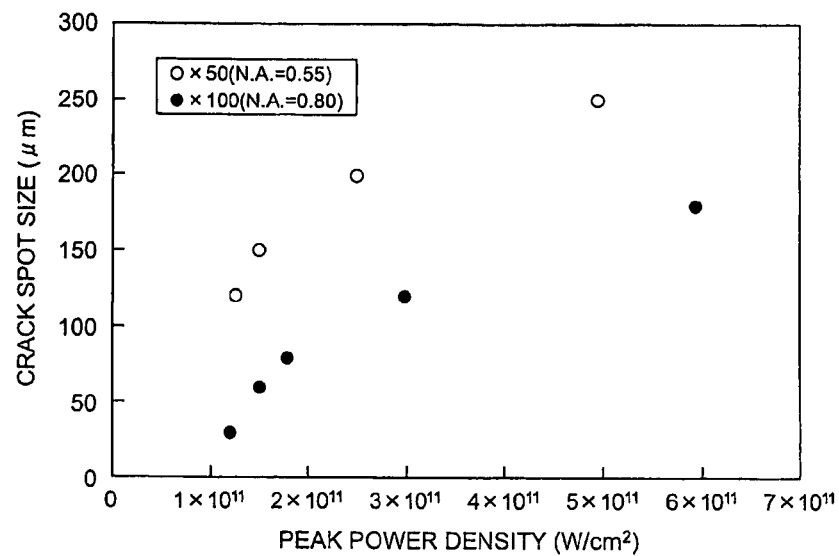
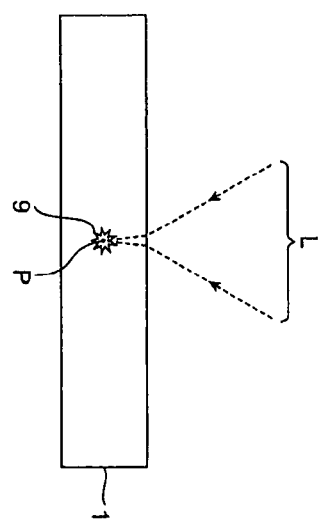
Fig.8

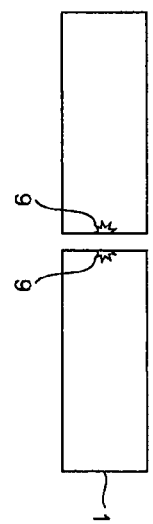
*Fig.11*
*Fig.12*
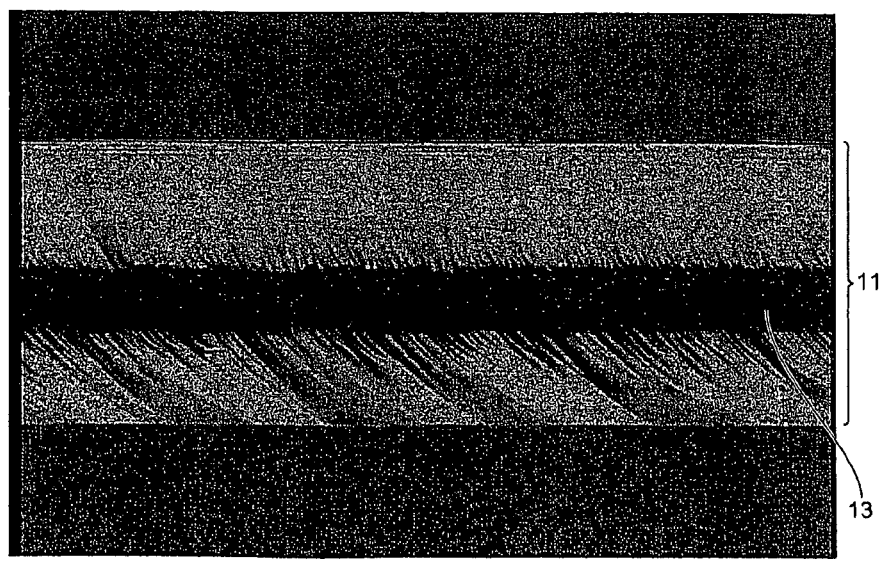

LASER PROCESSING METHOD FOR FORMING A MODIFIED REGION IN AN OBJECT

TECHNICAL FIELD

The present invention relates to a laser processing method for cutting a planar object to be processed along a line to cut.

BACKGROUND ART

As a technique for cutting a planar object to be processed along a line to cut, there is one known as blade dicing method (see, for example, Patent Literature 1). The blade dicing method attaches the planar object to an expandable sheet stretched over an annular frame, secures it onto a mount table, and cuts the object along a line to cut with a cutting blade rotating at a high speed. Here, for preventing the frame surrounding the object from being damaged, the cutting blade is moved relative to the object only in an area on the inside of the frame.

On the other hand, as a laser processing method for cutting a planar object to be processed along a line to cut, there is one which attaches the planar object to an expandable sheet stretched over an annular frame, secures it onto a mount table, and irradiates the object with processing laser light while locating a converging point within the object with a converging lens, so as to form a modified region to become a starting point region for cutting within the object along the line to cut (see, for example, Patent Literature 2).

Unlike the blade dicing method, it is necessary for such a laser processing method to move the converging lens relative to the object beyond the frame. The following are the reasons therefor. For irradiating the object with the processing laser light in a state where the relative moving speed of the converging lens with respect to the object is constant, an acceleration distance by which the relative moving speed becomes constant is required to be added to the relative movement distance of the converging lens with respect to the object. Also, while there is a case where the object is cut along the line to cut from the modified region acting as a cutting start point by expanding the expandable sheet outward, for example, it is necessary for the frame to be made as small as possible with respect to the object in order to realize reliable cutting.

Patent Literature 1: Japanese Patent Application Laid-Open No. 2006-13312
Patent Literature 2: Japanese Patent Application Laid-Open No. 2004-273895

DISCLOSURE OF INVENTION

Technical Problem

However, the following problem exists in laser processing methods such as those mentioned above. For example, there is a case where measuring laser light is converged by a converging lens, the quantity of a reflected light component of the measuring laser light is detected, and the processing laser light is converged by the converging lens in order to form the modified region within the object when the light quantity exceeds a predetermined threshold. Here, since the converging lens is moved relative to the object beyond the frame, the frame having a high reflectance as with the object may be erroneously recognized as the object, whereby the frame may be irradiated with the processing laser light, which may damage not only the frame but also the object.

In view of such circumstances, it is an object of the present invention to provide a laser processing method which, when forming a modified region within a planar object to be processed attached to an expandable sheet stretched over an annular frame, can prevent the frame from being irradiated with and damaged by processing laser light.

Solution to Problem

For achieving the above-mentioned object, the laser processing method in accordance with one aspect of the present invention is a laser processing method of irradiating a planar object to be processed attached to an expandable sheet stretched over an annular frame with processing laser light while locating a converging point within the object with a converging lens, so as to form a modified region to become a cutting start point within the object along a line to cut the object; the method comprising the steps of setting a processing region having an outer shape between the object and the frame; and relatively moving at least one of the converging lens and object along a line including the line to cut and, while converging measuring laser light toward the processing region with the converging lens when the converging lens is positioned on the processing region and detecting a reflected light component of the measuring laser light reflected by a laser light irradiation surface of the object, so as to adjust a distance between the laser light irradiation surface and the converging lens such that the converging point of the processing laser light is located at a predetermined position with reference to the laser light irradiation surface, converging the processing laser light toward the object with the converging lens, so as to form the modified region within the object.

The laser processing method in accordance with another aspect of the present invention is a laser processing method of irradiating a planar object to be processed attached to an expandable sheet stretched over an annular frame with processing laser light while locating a converging point within the object with a converging lens, so as to form a modified region to become a cutting start point within the object along a line to cut the object; the method comprising the steps of setting a processing region having an outer shape between the object and the frame; relatively moving at least one of the converging lens and object along a line including the line to cut, converging measuring laser light toward the processing region with the converging lens when the converging lens is positioned on the processing region, and detecting a reflected light component of the measuring laser light reflected by a laser irradiation surface of the object, so as to adjust a distance between the laser light irradiation surface and the converging lens such that the converging point of the processing laser light is located at a predetermined position with reference to the laser light irradiation surface and acquire adjustment information concerning the adjustment; and relatively moving at least one of the converging lens and object along the line including the line to cut and, while adjusting the distance between the laser light irradiation surface and the converging lens according to the adjustment information when the converging lens is positioned on the processing region, converging the processing laser light toward the object with the converging lens, so as to form the modified region within the object.

These laser processing methods relatively move at least one of the converging lens and object along a line including the line to cut the object, converge measuring laser light toward a processing region having an outer shape between the object and the frame with the converging lens when the converging lens is positioned on the processing region, and detect a reflected light component of the measuring laser light reflected by the laser light irradiation surface of the object. Then, while adjusting the distance between the laser light irradiation surface and the converging lens such that the converging point of the processing laser light is located at a predetermined position with reference to the laser light irradiation surface according to results of detection of the reflected light component of the measuring laser light, the processing laser light is converged toward the object with the converging lens, so as to form the modified region within the object. As in the foregoing, these laser processing methods converge the processing laser light toward the object with the converging lens when the converging lens is positioned on a processing region having an outer shape between the object and the frame, so as to form the modified region within the object. Therefore, the frame can be prevented from being erroneously recognized as the object so as to be irradiated with the processing laser light and damaged even when the converging lens is relatively moved with respect to the object beyond the frame.

The modified region is formed by generating optical absorption such as multiphoton absorption within the object by irradiating the object with laser light while locating a converging point within the object.

Preferably, the laser processing method in accordance with the present invention converges the measuring laser light toward the processing region with the converging lens when the converging lens is positioned on the processing region, detects a quantity of the reflected light component of the measuring laser light reflected by the processing region, and adjusts the distance between the laser light irradiation surface and the converging lens such that the converging point of the processing laser light is located at the predetermined position with reference to the laser light irradiation surface when the light quantity exceeds a predetermined threshold. This can accurately form the modified region at the predetermined position with reference to the laser light irradiation surface.

Preferably, the laser processing method in accordance with the present invention converges the measuring laser light toward the processing region with the converging lens when the converging lens is positioned on the processing region, detects a quantity of the reflected light component of the measuring laser light reflected by the processing region, and adjusts the distance between the laser light irradiation surface and the converging lens such that a converged light image of the reflected light component of the measuring laser light having astigmatism added thereto becomes constant when the light quantity exceeds a predetermined threshold. This can accurately form the modified region at a constant distance from the laser light irradiation surface of the object even when the laser light irradiation surface wobbles.

Preferably, the laser processing method in accordance with the present invention cuts the object along the line to cut from the modified region acting as a cutting start point. This can accurately cut the object along the line to cut.

The laser processing method in accordance with the present invention encompasses a case where the object has a semiconductor substrate, while the modified region includes a molten processed region.

Advantageous Effects of Invention

When forming a modified region within a planar object to be processed attached to an expandable sheet stretched over an annular frame, the present invention can prevent the frame from being irradiated with and damaged by processing laser light.

BRIEF DESCRIPTION OF DRAWINGS

FIG. 7 is a graph illustrating relationships between the field intensity and crack spot size in the laser processing method in accordance with the embodiment;

FIG. 8 is a sectional view of the object in a first step of the laser processing method in accordance with the embodiment;

FIG. 11 is a sectional view of the object in a fourth step of the laser processing method in accordance with the embodiment;

FIG. 12 is a view illustrating a photograph of a cut section in a part of a silicon wafer cut by the laser processing method in accordance with the embodiment;

REFERENCE SIGNS LIST

1 . . . object to be processed; 3 . . . front face (laser light entrance surface); 5 . . . line to cut; 11 . . . silicon wafer (semiconductor substrate); 13 . . . molten processed region (modified region); 22 . . . frame; 23 . . . expandable tape (expandable sheet); 50 . . . line; 108 . . . converging lens;

L1 ... processing laser light; L2 ... measuring laser light; L3 ... reflected light component of measuring laser light; P ... converging point

DESCRIPTION OF EMBODIMENTS

In the following, a preferred embodiment of the present invention will be explained in detail with reference to the drawings. In the laser processing method in accordance with the embodiment, a phenomenon known as multiphoton absorption is used for forming a modified region within an object to be processed. Therefore, to begin with, a laser processing method for forming a modified region by the multiphoton absorption will be explained.

A material becomes transparent when its absorption bandgap $E_G$ is greater than photon energy hv. Consequently, a condition under which absorption occurs in the material is hv>$E_G$. However, even when optically transparent, the material generates absorption under a condition of nhv>$E_G$ (where n=2, 3, 4, ...) if the intensity of laser light becomes very high. This phenomenon is known as multiphoton absorption. In the case of pulsed waves, the intensity of laser light is determined by the peak power density (W/cm$^2$) of laser light at its converging point. The multiphoton absorption occurs under a condition where the peak power density is 1×10$^8$ (W/cm$^2$) or greater, for example. The peak power density is determined by (energy of laser light at the converging point per pulse)/(beam spot cross-sectional area of laser light×pulse width). In the case of continuous waves, the intensity of laser light is determined by the field intensity (W/cm$^2$) of laser light at the converging point.

Figure 2:
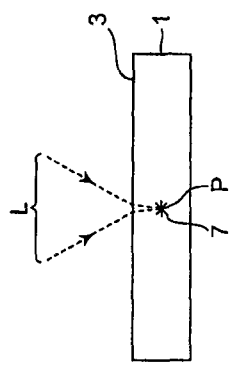
FIG. 2 is a sectional view of the object taken along the line II-II of FIG. 1.
Figure 1:
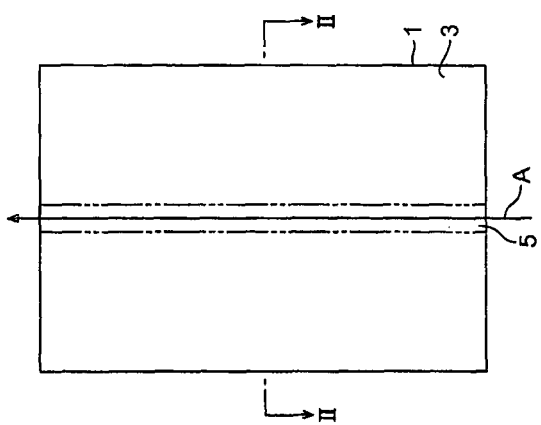
FIG. 1 is a plan view of an object to be processed during laser processing by a laser processing method in accordance with an embodiment.

The principle of the laser processing method in accordance with the embodiment using such multiphoton absorption will be explained with reference to FIGS. 1 to 6. As illustrated in FIG. 1, on a front face 3 of a wafer-like (planar) object to be processed 1, a line to cut 5 for cutting the object 1 exists. The line to cut 5 is a virtual line extending straight. As illustrated in FIG. 2, the laser processing method in accordance with this embodiment irradiates the object 1 with laser light L while locating a converging point P therewithin under a condition generating multiphoton absorption, so as to form a modified region 7. The converging point P is a position at which the laser light L is converged. The line to cut 5 may be curved instead of being straight, and may be a line actually drawn on the object 1 without being restricted to the virtual line.

Figure 4:
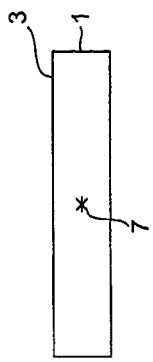
FIG. 4 is a sectional view of the object taken along the line IV-IV of FIG. 3.
Figure 3:
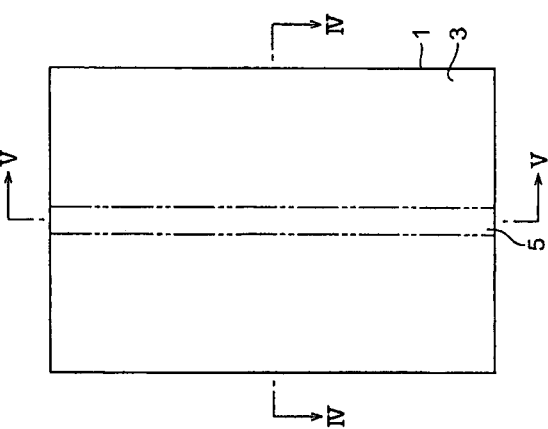
FIG. 3 is a plan view of the object after laser processing by the laser processing method in accordance with the embodiment.
Figure 5:
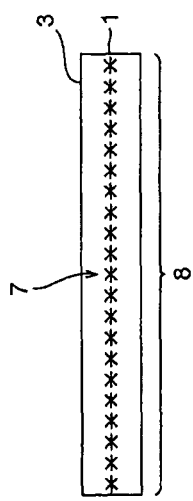
FIG. 5 is a sectional view of the object taken along the line V-V of FIG. 3.

Then, the laser light L is relatively moved along the line to cut 5 (i.e., in the direction of arrow A in FIG. 1), so as to shift the converging point P along the line to cut 5. Consequently, as illustrated in FIGS. 3 to 5, the modified region 7 is formed along the line to cut 5 within the object 1, and becomes a starting point region for cutting 8. The starting point region for cutting 8 refers to a region which becomes a start point for cutting (fracturing) when the object 1 is cut. The starting point region for cutting 8 may be made by forming the modified region 7 either continuously or intermittently.

In the laser processing method in accordance with this embodiment, the front face 3 of the object 1 hardly absorbs the laser light L and thus does not melt.

Figure 6:
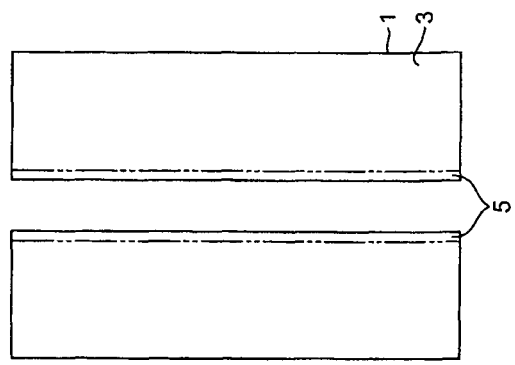
FIG. 6 is a plan view of the object cut by the laser processing method in accordance with the embodiment.

Forming the starting point region for cutting 8 within the object 1 makes it easier to generate fractures from the starting point region for cutting 8 acting as a start point, whereby the object 1 can be cut with a relatively small force as illustrated in FIG. 6. Therefore, the object 1 can be cut with a high precision without generating unnecessary fractures on the front face 3 of the object 1.

There seem to be the following two ways of cutting the object 1 from the starting point region for cutting 8 acting as a start point. One is where an artificial force is applied to the object 1 after the starting point region for cutting 8 is formed, so that the object 1 fractures from the starting point region for cutting 8 acting as a start point, whereby the object 1 is cut. This is the cutting in the case where the object 1 has a large thickness, for example. Applying an artificial force refers to exerting a bending stress or shear stress to the object 1 along the starting point region for cutting 8, or generating a thermal stress by applying a temperature difference to the object 1, for example. The other is where the forming of the starting point region for cutting 8 causes the object 1 to fracture naturally in its cross-sectional direction (thickness direction) from the starting point region for cutting 8 acting as a start point, thereby cutting the object 1. This becomes possible if the starting point region for cutting 8 is formed by one row of the modified region 7 when the object 1 has a small thickness, or if the starting point region for cutting 8 is formed by a plurality of rows of the modified region 7 in the thickness direction when the object 1 has a large thickness. Even in this naturally fracturing case, fractures do not extend onto the front face 3 at a portion corresponding to an area not formed with the starting point region for cutting 8 in the part to cut, so that only the portion corresponding to the area formed with the starting point region for cutting 8 can be cleaved, whereby cleavage can be controlled well. Such a cleaving method with a favorable controllability is very effective, since the object 1 to be processed such as a silicon wafer has recently been apt to decrease its thickness.

The modified region formed by multiphoton absorption in the laser processing method in accordance with this embodiment encompasses the following cases (1) to (3):

(1) Case where the Modified Region is a Crack Region Including One or a Plurality of Cracks An object to be processed (e.g., glass or a piezoelectric material made of LiTaO$_3$) is irradiated with laser light while locating a converging point therewithin under a condition with a field intensity of at least 1×10$^8$ (W/cm$^2$) at the converging point and a pulse width of 1 μs or less. This magnitude of pulse width is a condition under which a crack region can be formed only within the object while generating multiphoton absorption without causing unnecessary damages to the front face of the object. This generates a phenomenon of optical damage by multiphoton absorption within the object. This optical damage induces a thermal distortion within the object, thereby forming a crack region therewithin. The upper limit of field intensity is 1×10$^{12}$ (W/cm$^2$), for example. The pulse width is preferably 1 ns to 200 ns, for example. The forming of a crack region by multiphoton absorption is disclosed, for example, in "Internal Marking of Glass Substrate with Solid-state Laser", Proceedings of the 45th Laser Materials Processing Conference (December, 1998), pp. 23-28.

The inventors determined the relationship between field intensity and crack size by an experiment. The following are conditions of the experiment.

(A) Object to be processed: Pyrex (registered trademark) glass (with a thickness of 700 μm)
(B) Laser
Light source: semiconductor laser pumping Nd:YAG laser
Wavelength: 1064 nm
Laser light spot cross-sectional area: 3.14×10$^{-8}$ cm$^2$
Oscillation mode: Q-switched pulse
Repetition frequency: 100 kHz
Pulse width: 30 ns
Output: output<1 mJ/pulse
Laser light quality: TEM$_{00}$
Polarizing property: linear polarization (C) Converging lens Transmittance at a laser light wavelength: 60%

(D) Moving rate of the mount table mounting the object: 100 mm/sec

The laser light quality of $TEM_{00}$ means that the converging characteristic is so high that convergence to about the wavelength of laser light is possible.

FIG. 7 is a graph illustrating the results of the above-mentioned experiment. The abscissa indicates the peak power density. Since the laser light is pulsed laser light, the field intensity is represented by the peak power density. The ordinate indicates the size of a crack part (crack spot) formed within the object by one pulse of laser light. Crack spots gather to yield a crack region. The crack spot size is the size of a part yielding the maximum length among forms of crack spots. Data represented by black circles in the graph refer to a case where the converging lens (C) has a magnification of ×100 and a numerical aperture (NA) of 0.80. On the other hand, data represented by whitened circles in the graph refer to a case where the converging lens (C) has a magnification of ×50 and a numerical aperture (NA) of 0.55. Crack spots are seen to occur within the object from when the peak power density is about $10^{11}$ (W/cm$^2$) and become greater as the peak power density increases.

Figure 10:
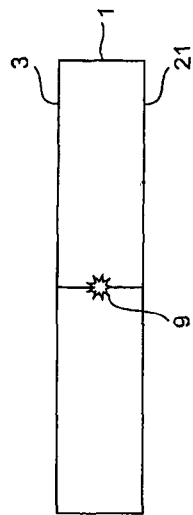
FIG. 10 is a sectional view of the object in a third step of the laser processing method in accordance with the embodiment.
Figure 9:
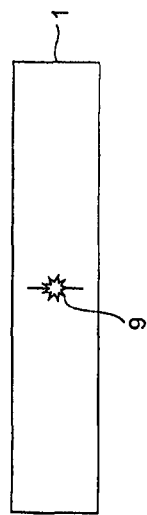
FIG. 9 is a sectional view of the object in a second step of the laser processing method in accordance with the embodiment.

A mechanism by which the object to be processed is cut by forming a crack region will now be explained with reference to FIGS. 8 to 11. As illustrated in FIG. 8, the object 1 is irradiated with laser light L while the converging point P is located within the object 1 under a condition where multiphoton absorption occurs, so as to form a crack region 9 therewithin along a line to cut. The crack region 9 is a region containing one or a plurality of cracks. Thus formed crack region 9 becomes a starting point region for cutting. A crack further grows from the crack region 9 acting as a start point (i.e., from the starting point region for cutting acting as a start point) as illustrated in FIG. 9, and reaches the front face 3 and rear face 21 of the object 1 as illustrated in FIG. 10, whereby the object 1 fractures and is consequently cut as illustrated in FIG. 11. The crack reaching the front face 3 and rear face 21 of the object 1 may grow naturally or as a force is applied to the object 1.

(2) Case where the Modified Region is a Molten Processed Region

An object to be processed (e.g., semiconductor material such as silicon) is irradiated with laser light while locating a converging point within the object under a condition with a field intensity of at least $1\times10^8$ (W/cm$^2$) at the converging point and a pulse width of 1 μs or less. As a consequence, the inside of the object is locally heated by multiphoton absorption. This heating forms a molten processed region within the object. The molten processed region encompasses regions once molten and then re-solidified, regions just in a molten state, and regions in the process of being re-solidified from the molten state, and can also be referred to as a region whose phase has changed or a region whose crystal structure has changed. The molten processed region may also be referred to as a region in which a certain structure has changed to another structure among monocrystal, amorphous, and polycrystal structures. For example, it means a region having changed from the monocrystal structure to the amorphous structure, a region having changed from the monocrystal structure to the polycrystal structure, or a region having changed from the monocrystal structure to a structure containing amorphous and polycrystal structures. When the object to be processed is of a silicon monocrystal structure, the molten processed region is an amorphous silicon structure, for example. The upper limit of field intensity is $1\times10^{12}$ (W/cm$^2$), for example. The pulse width is preferably 1 ns to 200 ns, for example.

By an experiment, the inventors verified that a molten processed region was formed within a silicon wafer (semiconductor substrate). The following are conditions of the experiment.

(A) Object to be processed: silicon wafer (with a thickness of 350 μm and an outer diameter of 4 inches)

(B) Laser

Light source: semiconductor laser pumping Nd:YAG laser

Wavelength: 1064 nm

Laser light spot cross-sectional area: $3.14\times10^{-8}$ cm$^2$

Oscillation mode: Q-switched pulse

Repetition frequency: 100 kHz

Pulse width: 30 ns

Output: 20 μJ/pulse

Laser light quality: $TEM_{00}$

Polarizing property: linear polarization (C) Converging lens

Magnification: ×50

NA.: 0.55

Transmittance at a laser light wavelength: 60%

(D) Moving rate of the mount table mounting the object: 100 mm/sec

FIG. 12 is a view illustrating a photograph of a cross section of a part of a silicon wafer cut by laser processing under the conditions mentioned above. A molten processed region 13 is formed within the silicon wafer 11. The molten processed region 13 formed under the above-mentioned conditions has a size of about 100 μm in the thickness direction.

Figure 13:
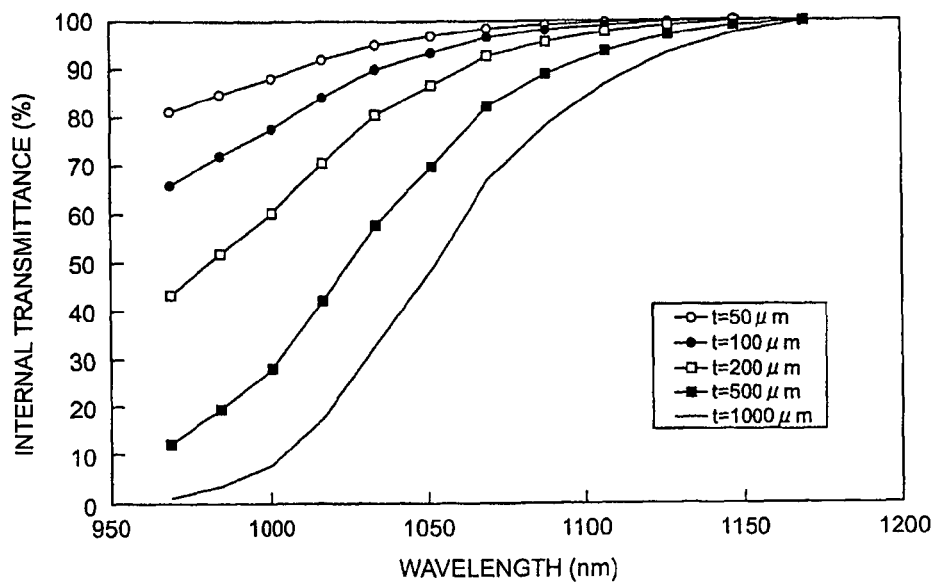
FIG. 13 is a graph illustrating relationships between the laser light wavelength and the transmittance within a silicon substrate in the laser processing method in accordance with the embodiment.

The fact that the molten processed region 13 is formed by multiphoton absorption will now be explained. FIG. 13 is a graph illustrating relationships between the laser light wavelength and the transmittance within the silicon substrate. Here, the respective reflected components on the front and rear sides of the silicon substrate are eliminated, so as to represent the internal transmittance alone. The respective relationships are illustrated in the cases where the thickness t of the silicon substrate is 50 μm, 100 μm, 200 μm, 500 μm, and 1000 μm.

For example, at the Nd:YAG laser wavelength of 1064 nm, the laser light appears to be transmitted through the silicon substrate by at least 80% when the silicon substrate has a thickness of 500 μm or less. Since the silicon wafer 11 illustrated in FIG. 12 has a thickness of 350 μm, the molten processed region 13 caused by multiphoton absorption is formed near the center of the silicon wafer 11, i.e., at a part distanced from the front face by 175 μm. The transmittance in this case is 90% or more with reference to a silicon wafer having a thickness of 200 μm, whereby the laser light is absorbed only slightly within the silicon wafer 11 but is substantially transmitted therethrough. This means that the molten processed region 13 is formed within the silicon wafer 11 not by the absorption of laser light within the silicon wafer 11 (i.e., not by usual heating with the laser light) but by multiphoton absorption. The forming of a molten processed region by multiphoton absorption is disclosed, for example, in "Ultrashort Pulse Laser Microprocessing of Silicon", Preprints of the National Meetings of Japan Welding Society, Vol. 66 (April, 2000), pp. 72-73.

A fracture is generated in a silicon wafer from a starting point region for cutting formed by a molten processed region, acting as a start point, in a cross-sectional direction, and reaches the front and rear faces of the silicon wafer, whereby the silicon wafer is cut. The fracture reaching the front and rear faces of the silicon wafer may grow naturally or as a force is applied to the silicon wafer. The fracture naturally growing from the starting point region for cutting to the front and rear faces of the silicon wafer encompasses a case where the fracture grows from a state in which the molten processed region forming the starting point region for cutting is molten and a case where the fracture grows when the molten processed region forming the starting point region for cutting is re-solidified from the molten state. In either case, the molten processed region is formed only within the silicon wafer, and thus is present only within the cut section after cutting as illustrated in FIG. 12. When a starting point region for cutting is thus formed within the object by a molten processed region, unnecessary fractures deviating from a starting point region for cutting line are harder to occur at the time of cleaving, whereby cleavage control becomes easier. Here, the molten processed region may be formed not only by multiphoton absorption but also by other absorption actions.

(3) Case where the Modified Region is a Refractive Index Change Region

An object to be processed (e.g., glass) is irradiated with laser light while locating a converging point within the object under a condition with a field intensity of at least $1 \times 10^8$ (W/cm$^2$) at the converging point and a pulse width of 1 ns or less. When multiphoton absorption is generated within the object with a very short pulse width, the energy caused by multiphoton absorption is not converted into thermal energy, whereby an eternal structure change such as ion valence change, crystallization, or orientation polarization is induced within the object, thus forming a refractive index change region. The upper limit of field intensity is $1 \times 10^{12}$ (W/cm$^2$), for example. The pulse width is preferably 1 ns or less, for example, more preferably 1 ps or less. The forming of a refractive index change region by multiphoton absorption is disclosed, for example, in "Forming of Photoinduced Structure within Glass by Femtosecond Laser Irradiation", Proceedings of the 42nd Laser Materials Processing Conference (November, 1997), pp. 105-111.

Though the cases (1) to (3) are explained in the foregoing as a modified region formed by multiphoton absorption, a starting point region for cutting may be formed as follows while taking account of the crystal structure of a wafer-like object to be processed, its cleavage characteristic, and the like, whereby the object can be cut with a favorable precision by a smaller force from the starting point region for cutting acting as a start point.

That is, in the case of a substrate made of a monocrystal semiconductor having a diamond structure such as silicon, it will be preferred if a starting point region for cutting is formed in a direction extending along a (111) plane (first cleavage plane) or a (110) plane (second cleavage plane). In the case of a substrate made of a group III-V compound semiconductor of sphalerite structure such as GaAs, it will be preferred if a starting point region for cutting is formed in a direction extending along a (110) plane. In the case of a substrate having a crystal structure of hexagonal system such as sapphire (Al$_2$O$_3$), it will be preferred if a starting point region for cutting is formed in a direction extending along a (1120) plane (A plane) or a (1100) plane (M plane) while using a (0001) plane (C plane) as a principal plane.

When the substrate is formed with an orientation flat in a direction to be formed with the above-mentioned starting point region for cutting (e.g., a direction extending along a (111) plane in a monocrystal silicon substrate) or a direction orthogonal to the former direction, the starting point region for cutting extending in the direction to be formed with the starting point region for cutting can be formed easily and accurately with reference to the orientation flat.

The preferred embodiment of the present invention will now be explained.

Figure 14:
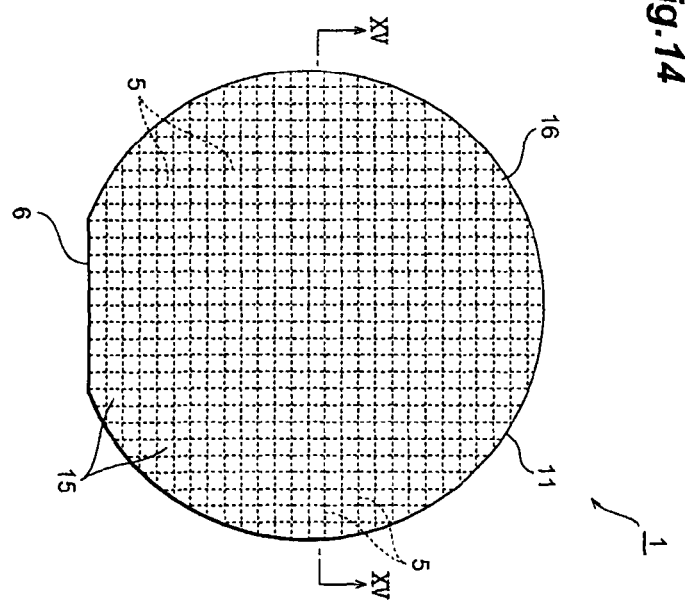
FIG. 14 is a plan view illustrating an object to be processed by the laser processing method in accordance with the embodiment.
Figure 15:
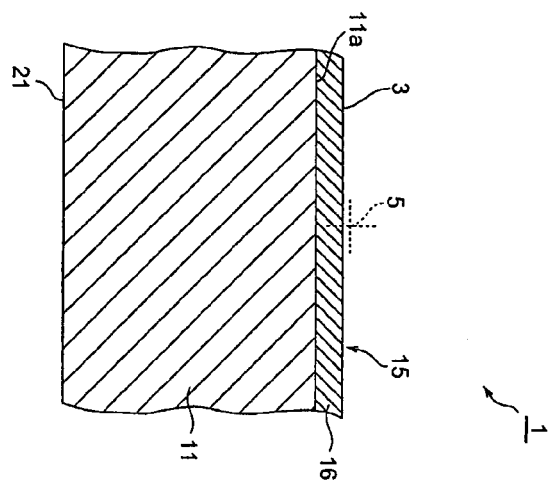
FIG. 15 is a partial sectional view taken along the line XV-XV of FIG. 14.

As illustrated in FIGS. 14 and 15, an object to be processed 1 comprises a silicon wafer (semiconductor substrate) 11 having a thickness of 100 μm and a functional device layer 16 which is formed on a front face 11a of the silicon wafer 11 while including a plurality of functional devices 15. A number of functional devices 15, examples of which include semiconductor operating layers formed by crystal growth, light-receiving devices such as photodiodes, light-emitting devices such as laser diodes, and circuit devices formed as circuits, are formed like a matrix in directions parallel and perpendicular to an orientation flat 6 of the silicon wafer 11.

Figure 16:
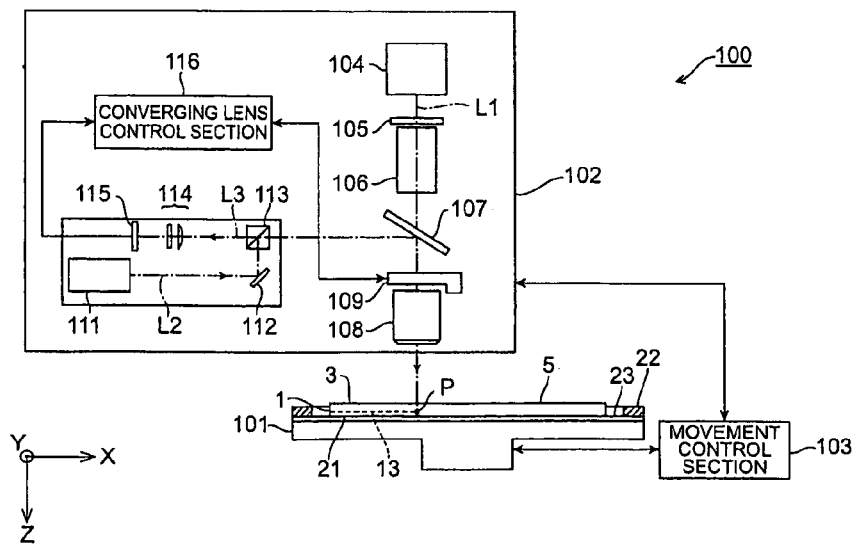
FIG. 16 is a configuration diagram of a laser processing apparatus which carries out the laser processing method in accordance with the embodiment.

Thus constructed object 1 is cut into the functional devices 15 as follows. First, as illustrated in FIG. 16, the rear face 21 of the object 1 is attached to an expandable tape (expandable sheet) 23 stretched over an annular frame 22. Then, with the front face 3 of the object 1 facing up, the frame 22 and expandable tape 23 holding the object 1 are secured onto a mount table 101 of a laser processing apparatus 100. Subsequently, lines to cut 5 are set like grids passing between the functional devices 15, 15 adjacent to each other (see FIG. 14). Then, the object 1 is irradiated with processing laser light L1 while using the front face 3 as a laser light irradiation surface and locating a converging point P within the silicon wafer 11, so as to form a molten processed region 13 along each line to cut 5. Subsequently, the frame 22 and expandable tape 23 holding the object 1 are mounted to an expandable tape expander (not depicted), and the expandable tape 23 is expended outward, so as to cut the object 1 along the lines to cut 5 from the molten processed region 13 acting as a cutting start point and separate a number of semiconductor chips obtained by the cutting from each other. The foregoing can accurately cut the object 1 along the lines to cut 5. The molten processed region 13 may include cracks mixed therein.

The laser processing apparatus 100 will now be explained. As illustrated in FIG. 16, the laser processing apparatus 100 comprises a mount table 101 for mounting the object 1 horizontally, a laser unit 102, and a movement control section 103 connected to both of the mount table 101 and laser unit 102. The movement control section 103 moves the mount table 101 in horizontal directions (X and Y directions) and the laser unit 102 in vertical directions (Z directions).

The laser unit 102 has a processing laser light source 104 for pulse-oscillating the processing laser light L1. The processing laser light L1 emitted from the processing laser light 104 successively passes through a shutter 105 for selectively transmitting and blocking the processing laser light L1 and a beam expander 106 for expanding the beam size, so as to be transmitted through a dichroic mirror 107, and then is converged by a converging lens 108, so as to irradiate the object 1. A piezoelectric device 109 for minutely adjusting the Z-directional position of the converging lens 108 is attached thereto.

The laser unit 102 has a measuring laser light source 111 for emitting measuring laser light L2 for irradiating a processing region 30 which will be explained later. The measuring laser light L2 emitted from the measuring laser light source 111 is reflected by a mirror 112, a half mirror 113, and the dichroic mirror 107 in succession, so as to descend the optical axis of the processing laser light L1, and then is converged by the converging lens 108, so as to irradiate the processing region 30.

The measuring laser light L2 having irradiated the processing region 30 is reflected by the processing region 30, and the resulting reflected light component L3 of the measuring laser light is made incident on the converging lens 108 again, so as to ascend the optical axis of the processing laser light L1, and then is reflected by the dichroic mirror 107, so as to be transmitted through the half mirror 113. The reflected light component L3 of the measuring laser light transmitted through the half mirror 113 is provided with astigmatism by a shaping optical system 114 composed of a cylindrical lens and a planoconvex lens and converged onto a light-receiving surface of a quadrant photodiode 115 formed by equally dividing a photodiode into four. A converged light image of the reflected light component L3 of the measuring laser light having the astigmatism added thereto is thus formed on the light-receiving surface of the quadrant photodiode 115, and consequently varies depending on the position of the converging point of the measuring laser light L3 with respect to the front face (laser light irradiation surface) 3 of the object 1 positioned within the processing region 30.

A converging lens control section 116 connected to the piezoelectric device 109 is connected to the quadrant photodiode 115. The converging lens control section 116 functions to detect the quantity of the reflected light component L3 of the measuring laser light reflected by the processing region 30, acquire the converged light image formed on the light-receiving surface of the quadrant photodiode 115 as a voltage value when the light quantity exceeds a predetermined threshold, drive the piezoelectric device 109 such that the voltage value becomes constant (i.e., the converged light image becomes constant), so as to keep a substantially constant distance between the front face 3 of the object 1 and the converging lens 108, and record the driving signal for the piezoelectric device 109 at that time.

The forming of the molten processed region 13 by thus constructed laser processing apparatus 100 will now be explained in more detail.

Figure 18:
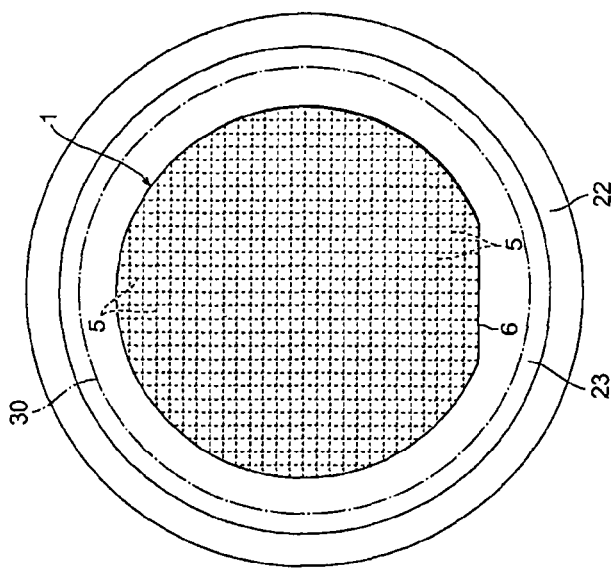
FIG. 18 is an explanatory view of the laser processing method in accordance with the embodiment subsequent to FIG. 17.
Figure 17:
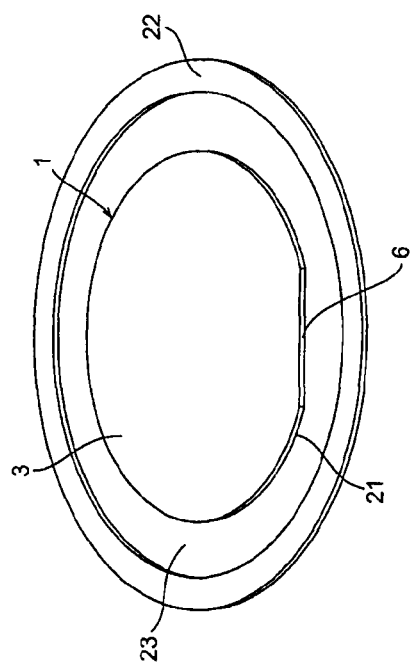
FIG. 17 is an explanatory view of the laser processing method in accordance with the embodiment.

First, as illustrated in FIG. 17, the rear face 21 of the object 1 is attached onto the expandable tape 23 stretched over the annular frame 22. Then, with the front face 3 of the object 1 facing up, the frame 22 and expandable tape 23 holding the object 1 are secured onto the mount table 101 of the laser processing apparatus 100. Subsequently, as illustrated in FIG. 18, lines to cut 5 are set like grids passing between the functional devices 15, 15 adjacent to each other, and the processing region 30 having an outer diameter greater than the outer diameter of the object 1 but smaller than the inner diameter of the frame 22 is set with reference to at least one of the object 1 and frame 22. Hence, the processing region 30 has an outer shape between the object 1 and the frame 22.

Figure 19:
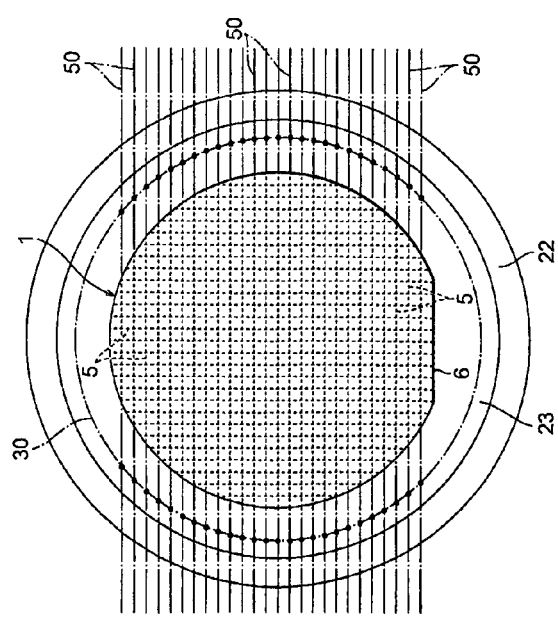
FIG. 19 is an explanatory view of the laser processing method in accordance with the embodiment subsequent to FIG. 18.

Subsequently, as illustrated in FIG. 19, coordinates of intersections between the outer shape of the processing region 30 and respective lines 50 including the lines to cut 5 parallel to the orientation flat 6 are acquired. Forming the molten processed region 13 along the lines to cut 5 perpendicular to the orientation flat 6 is similar to forming the molten processed region 13 along the lines to cut 5 parallel to the orientation flat 6 and thus will not be explained in the following.

Figure 20:
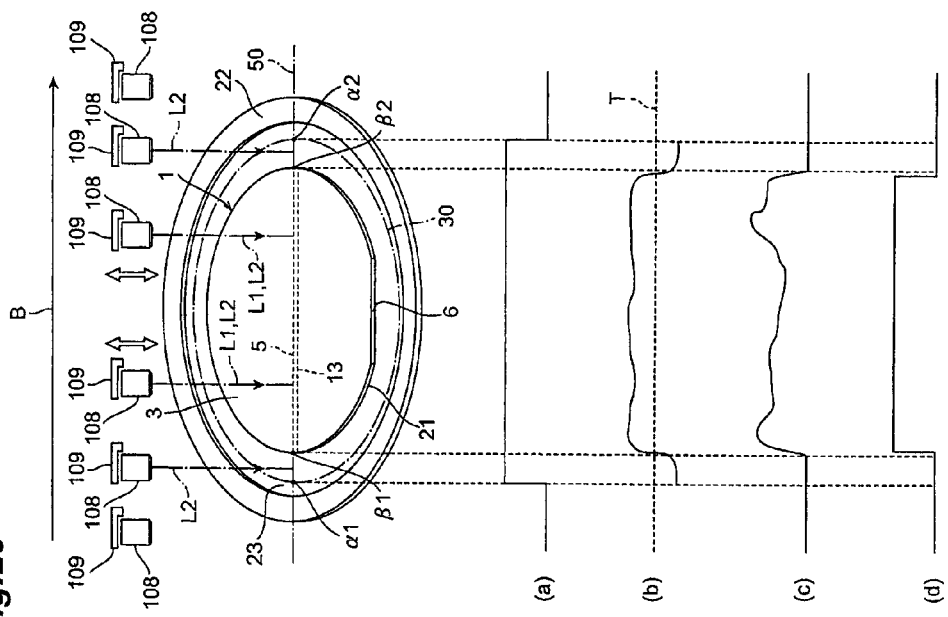
FIG. 20 is an explanatory view of the laser processing method in accordance with the embodiment subsequent to FIG. 19.

Next, as illustrated in FIG. 20, the mount table 101 is moved in a direction along which the lines to cut 5 parallel to the orientation flat 6 extend, so as to move the converging lens 108 relative to the object 1 in the direction of arrow B. Here, the converging lens 108 is moved relative to the object 1 beyond the frame 22 because of the following reasons. For irradiating the object 1 with the processing laser light L1 in a state where the relative moving speed of the converging lens 108 with respect to the object 1 is constant, an acceleration distance by which the relative moving speed becomes constant is required to be added to the relative movement distance of the converging lens 108 with respect to the object 1. Also, for reliably cutting the object 1 along the lines to cut 5 from the modified region 13 acting as a cutting start point by expanding the expandable tape 23 outward, it is necessary for the frame 22 to be made as small as possible with respect to the object 1.

When the converging lens 108 reaches one intersection α1 between the outer shape of the processing region 30 and a line 50 including a line to cut 5 as a result of the relative movement of the converging lens 108 with respect to the object 1, the control signal for the measuring laser light source 111 changes from "OFF" to "ON" as illustrated in FIG. 20(a), so that the measuring laser light L2 is emitted from the measuring laser light source 111 and converged by the converging lens 108. Though the measuring laser light L2 is reflected by the expandable tape 23 at this time, the quantity of the reflected light component L3 of the measuring laser light does not reach a threshold T as illustrated in FIG. 20(b), since the expandable tape 23 has a reflectance lower than that of the front face 3 of the object 1. Here, the driving signal for the piezoelectric device 109 is "OFF" as illustrated in FIG. 20(c), so that the converging lens 108 is held at a predetermined position.

Subsequently, when the converging lens 108 reaches one intersection β1 between the outer edge of the object 1 and the line 50 including the line to cut 5, the measuring laser light L2 is reflected by the front face 3 of the object 1, so that the quantity of the reflected light component L3 of the measuring laser light exceeds the threshold T as illustrated in FIG. 20(b). Consequently, the driving signal for the piezoelectric device 109 changes from "OFF" to "ON" as illustrated in FIG. 20(c), so as to drive the piezoelectric device 109 such that the voltage value based on the converged light image formed by the reflected light component L3 of the measuring laser light on the light-receiving surface of the quadrant photodiode 115 becomes constant, whereby a substantially constant distance is kept between the front face 3 of the object 1 and the converging lens 108.

At the same time, the control signal for the shutter 105 changes from "OFF" to "ON" as illustrated in FIG. 20(d), so that the processing laser light L1 emitted from the processing laser light source 104 is transmitted through the shutter 105 and converged by the converging lens 108. Consequently, the molten processed region 13 can accurately be formed at a constant distance (within the silicon wafer 11) from the front face 3 of the object 1 along the line to cut 5 even when the front face 3 of the object 1 wobbles. The timing at which the control signal for the shutter 105 changes from "OFF" to "ON" so as to irradiate the object 1 with the processing laser light L1 may be substantially the same as or slightly later than the timing at which the driving signal for the piezoelectric device 109 changes from "OFF" to "ON".

Subsequently, when the converging lens 108 reaches the other intersection β2 between the outer edge of the object 1 and the line 50 including the line to cut 5, the measuring laser light L2 is reflected by the expandable tape 23, so that the quantity of the reflected light component L3 of the measuring laser light falls from the threshold T as illustrated in FIG. 20(b). Consequently, the driving signal for the piezoelectric device 109 changes from "ON" to "OFF" as illustrated in FIG. 20(c), whereby the converging lens 108 is held at the predetermined position. At the same time, the control signal for the shutter 105 changes from "ON" to "OFF" as illustrated in FIG. 20(d), so as to block the processing laser light L1 emitted from the processing laser light source 104.

Next, when the converging lens 108 reaches the other intersection α2 between the outer shape of the processing region 30 and the line 50 including the line to cut 5, the control signal for the measuring laser light source 111 changes from "ON" to "OFF" as illustrated in FIG. 20(a), so that the laser light source 111 stops emitting the measuring laser light L2.

As explained in the foregoing, the laser processing method in accordance with this embodiment moves the converging lens 108 relative to the object 1 along the lines 50 including the lines to cut 5, converges the measuring laser light L2 toward the processing region 30 with the converging lens 108 when the converging lens 108 is positioned on the processing region 30 having the outer shape between the object 1 and frame 22, and detects the reflected light component L3 of the measuring laser light reflected by the front face 3 of the object 1. While keeping a substantially constant distance between the front face 3 of the object 1 and the converging lens 108 such that the converging point P of the processing laser light L1 is positioned at a constant distance from the front face 3 of the object 1 by detecting the reflected light component L3 of the measuring laser light, the processing laser light L1 is converged by the converging lens 108 toward the object 1, so as to form the molten processed region 13 within the object 1. Thus, when the converging lens 108 is positioned on the processing region 30 having the outer shape between the object 1 and the frame 22, the laser processing method in accordance with this embodiment converges the processing laser light L1 toward the object 1 with the converging lens 108, so as to form the molten processed region 13 within the object 1. This can prevent the frame 22 from being erroneously recognized as an object to be processed, so as to be irradiated with and damaged by the processing laser light L1, even when the converging lens 108 is moved relative to the object 1 beyond the frame 22.

The present invention is not limited to the above-mentioned embodiment.

For example, when relatively moving at least one of the converging lens 108 and object 1 along a line 50 traversing the frame 22, the control in the laser processing apparatus 100 may be carried out as follows while performing the irradiation with the measuring laser light L2. Until the converging lens 108 reaches one intersection a 1 between the outer shape of the processing region 30 and the line 50 from one side, an arithmetic operation (hereinafter referred to as "autofocus arithmetic operation") based on the quantity of the reflected light component L3 of the measuring laser light for adjusting the distance between the front face 3 of the object 1 and the converging lens 108 is stopped, so as to secure the converging lens 108 at a constant position in the thickness direction of the object 1, and the irradiation with the processing laser light L1 is stopped. Subsequently, until the converging lens 108 reaches one intersection β1 between the outer edge of the object 1 and the line 50 from one intersection α1, the autofocus arithmetic operation is carried out, the converging lens 108 is secured at a constant position in the thickness direction of the object 1, and the irradiation with the processing laser light L1 is stopped. Here, the converging lens 108 is secured at a predetermined position in the thickness direction of the object 1 even when carrying out the autofocus arithmetic operation, since the quantity of the reflected light component L3 of the measuring laser light does not exceed a predetermined threshold. Then, until the converging lens 108 reaches the other intersection β2 between the outer edge of the object 1 and the line 50 from one intersection β1, the autofocus arithmetic operation is carried out, so as to adjust the distance between the front face 3 of the object 1 and the converging lens 108, and the irradiation with the processing laser light L1 is performed.

The molten processed region 13 may be formed within the object 1 as follows after setting the processing region 30 having the outer shape between the object 1 and the frame 22.

First the converging lens 108 is moved relative to the object 1 along the line 50 including the line to cut 5, the measuring laser light L2 is converged toward the processing region 30 with the converging lens 108 when the converging lens 108 is positioned on the processing region 30, the reflected light component L3 of the measuring laser light reflected by the front face 3 of the object 1 is detected, so as to drive the piezoelectric device 109 such that the converging point P of the processing laser light L1 is positioned at a constant distance from the front face 3 of the object 1, thus keeping a substantially constant distance between the front face 3 of the object 1 and the converging lens 108, and the driving signal for the piezoelectric device 109 (adjustment information) at that time is recorded.

Subsequently, the converging lens 108 is moved relative to the object 1 along the line 50 including the line to cut 5 and, while the recorded driving signal is reproduced so as to drive the piezoelectric device 109 when the converging lens 108 is positioned on the processing region 30, such that a substantially constant distance is kept between the front face 3 of the object 1 and the converging lens 108, the processing laser light L1 is converged toward the object 1 with the converging lens 108, so as to form the molten processed region 13 within the object 1. The timing at which the control signal for the shutter 105 changes from "OFF" to "ON", so as to irradiate the object 1 with the processing laser light L1, may be substantially the same as or slightly earlier than the timing at which the driving signal for the piezoelectric device 109 changes from "OFF" to "ON".

The forming of the molten processed region 13 as in the foregoing is effective when the object 1 is relatively thick so that a plurality of rows of molten processed regions 13 are formed per line to cut such as to align in the thickness direction of the object 1.

The distance between the front face 3 of the object 1 and the converging lens 108 is adjusted such that the converging point P of the processing laser light L1 is positioned at a constant distance from the front face 3 of the object 1 in the above-mentioned embodiment, but may be adjusted such that the converging point P of the processing laser light L1 is located at a predetermined position with reference to the front face 3 of the object 1. This can accurately form the modified region 13 at a predetermined position with reference to the front face 3 of the object 1, whereby a molten processed region 13 whose distance from the front face 3 of the object 1 changes therewithin, a wavy molten processed region 13, and the like can be formed along the lines to cut 5.

Though the above-mentioned embodiment detects the reflected light component L3 of the measuring laser light reflected by the front face 3 of the object 1, the reflected light component L3 of the measuring laser light reflected by other laser light irradiation surfaces such as the rear face 21 of the object 1 may be detected.

Though the above-mentioned embodiment forms the modified region 13 within the silicon wafer 11 of the object 1, other modified regions such as crack regions and refractive index change regions may be formed within a wafer made of other materials such as glass and piezoelectric materials.

INDUSTRIAL APPLICABILITY

When forming a modified region within a planar object to be processed attached to an expandable sheet stretched over an annular frame, the present invention can prevent the frame from being irradiated with and damaged by processing laser light.

The invention claimed is:

1. A laser processing method of irradiating a planar object to be processed attached to an expandable sheet stretched over an annular frame with processing laser light while locating a converging point within the object with a converging lens, so as to form a modified region to become a cutting start point within the object along a line to cut the object, the method comprising the steps of:
    setting a processing region having an outer shape between the object and the frame;
    obtaining coordinates of one intersection between a line including the line to cut and the outer shape of the processing region and coordinates of the other intersection between the line and the outer shape of the processing region; and
    adjustment information acquiring step of relatively moving at least one of the converging lens and object along the line including the line to cut and, while converging measuring laser light toward the processing region with the converging lens when the converging lens is positioned on the processing region, in the period from when the converging lens reaches the one intersection between the line and the outer shape of the processing region to when the converging lens reaches the other intersection between the line and the outer shape of the processing region, and detecting a reflected light component of the measuring laser light reflected by a laser light irradiation surface of the object, so as to adjust a distance between the laser light irradiation surface and the converging lens such that the converging point of the converging lens is located at a predetermined position with reference to the laser light irradiation surface, converging the processing laser light toward the object with the converging lens, so as to form the modified region within the object,
    wherein in the step of forming the modified region within the object at least one of step (i) and step (ii) is performed,
    (i) starting emission of the measuring laser light when the converging lens reaches the one intersection between the line and the outer shape of the processing region, and stopping the emission of the measuring laser light when the converging lens reaches the other intersection between the line and the outer shape of the processing region;
    (ii) starting an arithmetic operation based on a quantity of the reflected light component of the measuring laser light when the converging lens reaches the one intersection between the line and the outer shape of the processing region, and stopping the arithmetic operation when the converging lens reaches the other intersection between the line and the outer shape of the processing region wherein the arithmetic operation is a focusing operation of the converging lens.

2. A laser processing method according to claim 1, wherein the measuring laser light is converged toward the processing region with the converging lens when the converging lens is positioned on the processing region, a quantity of the reflected light component of the measuring laser light reflected by the processing region is detected, and the distance between the laser light irradiation surface and the converging lens is adjusted such that the converging point of the processing laser light is located at the predetermined position with reference to the laser light irradiation surface when the light quantity exceeds a predetermined threshold.

3. A laser processing method according to claim 1, wherein the measuring laser light is converged toward the processing region with the converging lens when the converging lens is positioned on the processing region, a quantity of the reflected light component of the measuring laser light reflected by the processing region is detected, and the distance between the laser light irradiation surface and the converging lens is adjusted such that a converged light image of the reflected light component of the measuring laser light having astigmatism added thereto becomes constant when the light quantity exceeds a predetermined threshold.

4. A laser processing method according to claim 1, wherein the object is cut along the line to cut from the modified region acting as a cutting start point.

5. A laser processing method according to claim 1, wherein the object has a semiconductor substrate, and wherein the modified region includes a molten processed region.

6. A laser processing method of irradiating a planar object to be processed attached to an expandable sheet stretched over an annular frame with processing laser light while locating a converging point within the object with a converging lens, so as to form a modified region to become a cutting start point within the object along a line to cut the object, the method comprising the steps of:
    setting a processing region having an outer shape between the object and the frame;
    obtaining coordinates of one intersection between a line including the line to cut and the outer shape of the processing region and coordinates of the other intersection between the line and the outer shape of the processing region;
    adjustment information acquiring step of relatively moving at least one of the converging lens and object along the line including the line to cut, converging measuring laser light toward the processing region with the converging lens when the converging lens is positioned on the processing region, in the period from when the converging lens reaches the one intersection between the line and the outer shape of the processing region to when the converging lens reaches the other intersection between the line and the outer shape of the processing region, and detecting a reflected light component of the measuring laser light reflected by a laser irradiation surface of the object, so as to adjust a distance between the laser light irradiation surface and the converging lens such that the converging point of the converging lens is located at a predetermined position with reference to the laser light irradiation surface and acquire adjustment information for maintaining the distance between the laser light irradiation surface and the converging lens; and
    modified region forming step of relatively moving at least one of the converging lens and object along the line including the line to cut and, while adjusting the distance between the laser light irradiation surface and the converging lens according to the adjustment information when the converging lens is positioned on the processing region, converging the processing laser light toward the object with the converging lens, so as to form the modified region within the object with the processing laser light,
    wherein in the adjustment information acquiring step, at least one of step (i) and step (ii) is performed,
    (i) starting emission of the measuring laser light when the converging lens reaches the one intersection between the line and the outer shape of the processing region, and stopping the emission of the measuring laser light when the converging lens reaches the other intersection between the line and the outer shape of the processing region;

(ii) starting an arithmetic operation based on a quantity of the reflected light component of the measuring laser light when the converging lens reaches the one intersection between the line and the outer shape of the processing region, and stopping the arithmetic operation when the converging lens reaches the other intersection between the line and the outer shape of the processing region, wherein the arithmetic operation is a focusing operation of the converging lens.

7. A laser processing method according to claim 6, wherein the measuring laser light is converged toward the processing region with the converging lens when the converging lens is positioned on the processing region, a quantity of the reflected light component of the measuring laser light reflected by the processing region is detected, and the distance between the laser light irradiation surface and the converging lens is adjusted such that the converging point of the processing laser light is located at the predetermined position with reference to the laser light irradiation surface when the light quantity exceeds a predetermined threshold.

8. A laser processing method according to claim 6, wherein the measuring laser light is converged toward the processing region with the converging lens when the converging lens is positioned on the processing region, a quantity of the reflected light component of the measuring laser light reflected by the processing region is detected, and the distance between the laser light irradiation surface and the converging lens is adjusted such that a converged light image of the reflected light component of the measuring laser light having astigmatism added thereto becomes constant when the light quantity exceeds a predetermined threshold.

9. A laser processing method according to claim 6, wherein the object is cut along the line to cut from the modified region acting as a cutting start point.

10. A laser processing method according to claim 6, wherein the object has a semiconductor substrate, and wherein the modified region includes a molten processed region.

11. A laser processing method according to claim 1, wherein at least one of the converging lens and object is relatively moved along the line traversing the frame;
wherein, until the converging lens reaches one intersection between the line and the outer shape of the processing region from one side, an arithmetic operation based on a quantity of the reflected light component of the measuring laser light for adjusting the distance between the laser light irradiation surface and the converging lens is stopped, the converging lens is secured at a constant position in the thickness direction of the object, and the irradiation with the processing laser light is stopped;
wherein, until the converging lens reaches one intersection between the line and an outer edge of the object from one intersection between the line and the outer shape of the processing region, the arithmetic operation based on the quantity of the reflected light component of the measuring laser light reflected by the expandable sheet is performed, the converging lens is secured at a constant position in the thickness direction of the object, and the irradiation with the processing laser light is stopped; and
wherein, in the period from when the converging lens reaches the one intersection between the line and the outer edge of the object to when the converging lens reaches the other intersection between the line and the outer edge of the object, the arithmetic operation based on the quantity of the reflected light component of the measuring laser light reflected by the object is performed, the distance between the laser light irradiation surface and the converging lens is adjusted, and the irradiation with the processing laser light is carried out.

12. A laser processing method according to claim 2, wherein at least one of the converging lens and object is relatively moved along the line traversing the frame;
wherein, until the converging lens reaches one intersection between the line and the outer shape of the processing region from one side, an arithmetic operation based on a quantity of the reflected light component of the measuring laser light for adjusting the distance between the laser light irradiation surface and the converging lens is stopped, the converging lens is secured at a constant position in the thickness direction of the object, and the irradiation with the processing laser light is stopped;
wherein, until the converging lens reaches one intersection between the line and an outer edge of the object from one intersection between the line and the outer shape of the processing region, the arithmetic operation based on the quantity of the reflected light component of the measuring laser light reflected by the expandable sheet is performed, the converging lens is secured at a constant position in the thickness direction of the object, and the irradiation with the processing laser light is stopped; and
wherein, in the period from when the converging lens reaches the one intersection between the line and the outer edge of the object to when the converging lens reaches the other intersection between the line and the outer edge of the object, the arithmetic operation based on the quantity of the reflected light component of the measuring laser light reflected by the object is performed, the distance between the laser light irradiation surface and the converging lens is adjusted, and the irradiation with the processing laser light is carried out.

13. A laser processing method according to claim 3, wherein at least one of the converging lens and object is relatively moved along the line traversing the frame;
wherein, until the converging lens reaches one intersection between the line and the outer shape of the processing region from one side, an arithmetic operation based on a quantity of the reflected light component of the measuring laser light for adjusting the distance between the laser light irradiation surface and the converging lens is stopped, the converging lens is secured at a constant position in the thickness direction of the object, and the irradiation with the processing laser light is stopped;
wherein, until the converging lens reaches one intersection between the line and an outer edge of the object from one intersection between the line and the outer shape of the processing region, the arithmetic operation based on the quantity of the reflected light component of the measuring laser light reflected by the expandable sheet is performed, the converging lens is secured at a constant position in the thickness direction of the object, and the irradiation with the processing laser light is stopped; and
wherein, in the period from when the converging lens reaches the one intersection between the line and the outer edge of the object to when the converging lens reaches the other intersection between the line and the outer edge of the object, the arithmetic operation based on the quantity of the reflected light component of the measuring laser light reflected by the object is performed, the distance between the laser light irradiation surface and the converging lens is adjusted, and the irradiation with the processing laser light is carried out.

14. A laser processing method according to claim 6, wherein at least one of the converging lens and object is relatively moved along the line traversing the frame;

wherein, until the converging lens reaches one intersection between the line and the outer shape of the processing region from one side, an arithmetic operation based on a quantity of the reflected light component of the measuring laser light for adjusting the distance between the laser light irradiation surface and the converging lens is stopped, the converging lens is secured at a constant position in the thickness direction of the object;

wherein, until the converging lens reaches one intersection between the line and an outer edge of the object from one intersection between the line and the outer shape of the processing region, the arithmetic operation based on the quantity of the reflected light component of the measuring laser light reflected by the expandable sheet is performed, the converging lens is secured at a constant position in the thickness direction of the object; and wherein, in the period from when the converging lens reaches the one intersection between the line and the outer edge of the object to when the converging lens reaches the other intersection between the line and the outer edge of the object, the arithmetic operation based on the quantity of the reflected light component of the measuring laser light reflected by the object is performed, the distance between the laser light irradiation surface and the converging lens is adjusted and the adjustment information for maintaining the distance between the laser light irradiation surface and the converging lens constant is acquired.

15. A laser processing method according to claim 7, wherein at least one of the converging lens and object is relatively moved along the line traversing the frame;

wherein, until the converging lens reaches one intersection between the line and the outer shape of the processing region from one side, an arithmetic operation based on a quantity of the reflected light component of the measuring laser light for adjusting the distance between the laser light irradiation surface and the converging lens is stopped, the converging lens is secured at a constant position in the thickness direction of the object;

wherein, until the converging lens reaches one intersection between the line and an outer edge of the object from one intersection between the line and the outer shape of the processing region, the arithmetic operation based on the quantity of the reflected light component of the measuring laser light reflected by the expandable sheet is performed, the converging lens is secured at a constant position in the thickness direction of the object; and wherein, in the period from when the converging lens reaches the one intersection between the line and the outer edge of the object to when the converging lens reaches the other intersection between the line and the outer edge of the object, the arithmetic operation based on the quantity of the reflected light component of the measuring laser light reflected by the object is performed, the distance between the laser light irradiation surface and the converging lens is adjusted and the adjustment information for maintaining the distance between the laser light irradiation surface and the converging lens constant is acquired.

16. A laser processing method according to claim 8, wherein at least one of the converging lens and object is relatively moved along the line traversing the frame;

wherein, until the converging lens reaches one intersection between the line and the outer shape of the processing region from one side, an arithmetic operation based on a quantity of the reflected light component of the measuring laser light for adjusting the distance between the laser light irradiation surface and the converging lens is stopped, the converging lens is secured at a constant position in the thickness direction of the object;

wherein, until the converging lens reaches one intersection between the line and an outer edge of the object from one intersection between the line and the outer shape of the processing region, the arithmetic operation based on the quantity of the reflected light component of the measuring laser light reflected by the expandable sheet is performed, the converging lens is secured at a constant position in the thickness direction of the object; and wherein, in the period from when the converging lens reaches the one intersection between the line and the outer edge of the object to when the converging lens reaches the other intersection between the line and the outer edge of the object, the arithmetic operation based on the quantity of the reflected light component of the measuring laser light reflected by the object is performed, the distance between the laser light irradiation surface and the converging lens is adjusted and the adjustment information for maintaining the distance between the laser light irradiation surface and the converging lens constant is acquired.

17. A laser processing method according to claim 1, wherein at least one of the converging lens and object is relatively moved along the line traversing the frame;

wherein, until the converging lens reaches one intersection between the line and the outer shape of the processing region from one side, emission of the measuring laser light is stopped, the converging lens is secured at a constant position in the thickness direction of the object, and the irradiation with the processing laser light is stopped;

wherein, until the converging lens reaches one intersection between the line and an outer edge of the object from one intersection between the line and the outer shape of the processing region, the emission of the measuring laser light is performed, the reflected light component of the measuring laser light reflected by the expandable sheet is detected, the converging lens is secured at a constant position in the thickness direction of the object, and the irradiation with the processing laser light is stopped; and wherein, in the period from when the converging lens reaches the one intersection between the line and the outer edge of the object to when the converging lens reaches the other intersection between the line and the outer edge of the object, the emission of the measuring laser light is performed, the reflected light component of the measuring laser light reflected by the object is detected, the distance between the laser light irradiation surface and the converging lens is adjusted, and the irradiation with the processing laser light is carried out.

18. A laser processing method according to claim 2, wherein at least one of the converging lens and object is relatively moved along the line traversing the frame;

wherein, until the converging lens reaches one intersection between the line and the outer shape of the processing region from one side, emission of the measuring laser light is stopped, the converging lens is secured at a constant position in the thickness direction of the object, and the irradiation with the processing laser light is stopped;

wherein, until the converging lens reaches one intersection between the line and an outer edge of the object from one intersection between the line and the outer shape of the processing region, the emission of the measuring laser light is performed, the reflected light component of the measuring laser light reflected by the expandable sheet is detected, the converging lens is secured at a constant position in the thickness direction of the object, and the irradiation with the processing laser light is stopped; and wherein, in the period from when the converging lens reaches the one intersection between the line and the outer edge of the object to when the converging lens reaches the other intersection between the lure and the outer edge of the object, the emission of the measuring laser light is performed, the reflected light component of the measuring laser light reflected by the object is detected, the distance between the laser light irradiation surface and the converging lens is adjusted, and the irradiation with the processing laser light is carried out.

19. A laser processing method according to claim 3, wherein at least one of the converging lens and object is relatively moved along the line traversing the frame;

wherein, until the converging lens reaches one intersection between the line and the outer shape of the processing region from one side, emission of the measuring laser light is stopped, the converging lens is secured at a constant position in the thickness direction of the object, and the irradiation with the processing laser light is stopped;

wherein, until the converging lens reaches one intersection between the line and an outer edge of the object from one intersection between the line and the outer shape of the processing region, the emission of the measuring laser light is performed, the reflected light component of the measuring laser light reflected by the expandable sheet is detected, the converging lens is secured at a constant position in the thickness direction of the object, and the irradiation with the processing laser light is stopped; and wherein, in the period from when the converging lens reaches the one intersection between the line and the outer edge of the object to when the converging lens reaches the other intersection between the line and the outer edge of the object, the emission of the measuring laser light is performed, the reflected light component of the measuring laser light reflected by the object is detected, the distance between the laser light irradiation surface and the converging lens is adjusted, and the irradiation with the processing laser light is carried out.

20. A laser processing method according to claim 6, wherein at least one of the converging lens and object is relatively moved along the line traversing the frame;

wherein, until the converging lens reaches one intersection between the line and the outer shape of the processing, region from one side, emission of the measuring laser light is stopped, the converging lens is secured at a constant position in the thickness direction of the object;

wherein, until the converging lens reaches one intersection between the line and an outer edge of the object from one intersection between the line and the outer shape of the processing region, the emission of the measuring laser light is performed, the reflected light component of the measuring laser light reflected by the expandable sheet is detected, the converging lens is secured at a constant position in the thickness direction of the object; and wherein, in the period from when the converging lens reaches the one intersection between the line and the outer edge of the object to when the converging lens reaches the other intersection between the line and the outer edge of the object, the emission of the measuring laser light is performed, the reflected light component of the measuring laser light reflected by the object is detected, the distance between the laser light irradiation surface and the converging lens is adjusted, and the adjustment information for maintaining the distance between the laser light irradiation surface and the converging lens constant is acquired.

21. A laser processing method according to claim 7, wherein at least one of the converging lens and object is relatively moved along the line traversing the frame;

wherein, until the converging lens reaches one intersection between the line and the outer shape of the processing region from one side, emission of the measuring laser light is stopped, the converging lens is secured at a constant position in the thickness direction of the object;

wherein, until the converging lens reaches one intersection between the line and an outer edge of the object from one intersection between the line and the outer shape of the processing region, the emission of the measuring laser light is performed, the reflected light component of the measuring laser light reflected by the expandable sheet is detected, the converging lens is secured at a constant position in the thickness direction of the object; and wherein, in the period from when the converging lens reaches the one intersection between the line and the outer edge of the object to when the converging lens reaches the other intersection between the line and the outer edge of the object, the emission of the measuring laser light is performed, the reflected light component of the measuring laser light reflected by the object is detected, the distance between the laser light irradiation surface and the converging lens is adjusted, and the adjustment information for maintaining the distance between the laser light irradiation surface and the converging lens constant is acquired.

22. A laser processing method according to claim 8, wherein at least one of the converging lens and object is relatively moved along the line traversing the frame;

wherein, until the converging lens reaches one intersection between the line and the outer shape of the processing region from one side, emission of the measuring laser light is stopped, the converging lens is secured at a constant position in the thickness direction of the object;

wherein, until the converging lens reaches one intersection between the line and an outer edge of the object from one intersection between the line and the outer shape of the processing region, the emission of the measuring laser light is performed, the reflected light component of the measuring laser light reflected by the expandable sheet is detected, the converging lens is secured at a constant position in the thickness direction of the object; and wherein, in the period from when the converging lens reaches the one intersection between the line and the outer edge of the object to when the converging lens reaches the other intersection between the line and the outer edge of the object, the emission of the measuring laser light is performed, the reflected light component of the measuring laser light reflected by the object is detected, the distance between the laser light irradiation surface and the converging lens is adjusted, and the adjustment information for maintaining the distance between the laser light irradiation surface and the converging lens constant is acquired.

23. A laser processing method according to claim 1, wherein the processing region has an outer diameter that is greater than an outer diameter of the object but is smaller than an inner diameter of the frame.

24. A laser processing method according to claim 6, wherein the processing region has an outer diameter that is greater than an outer diameter of the object but is smaller than an inner diameter of the frame.

* * * * *